US006927723B2

United States Patent
Nomasaki et al.

(10) Patent No.: US 6,927,723 B2
(45) Date of Patent: Aug. 9, 2005

(54) A/D CONVERTER AND A/D CONVERSION METHOD

(75) Inventors: Daisuke Nomasaki, Ibaraki (JP); Kenji Murata, Katano (JP); Hideki Tanaka, Takatsuki (JP); Yoshinori Miyada, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/855,397

(22) Filed: May 28, 2004

(65) Prior Publication Data

US 2004/0257257 A1 Dec. 23, 2004

(30) Foreign Application Priority Data

May 30, 2003 (JP) ........................................ 2003-154975

(51) Int. Cl.[7] .................................................. H03M 1/12
(52) U.S. Cl. ...................................... 341/172; 341/155
(58) Field of Search .................................. 341/155, 172, 341/120, 144, 163, 139, 150, 143; 327/65, 91, 337, 554; 708/313, 314

(56) References Cited

U.S. PATENT DOCUMENTS

| 5,081,454 A | | 1/1992 | Campbell, Jr. et al. |
| 5,606,320 A | * | 2/1997 | Kleks ........................... 341/161 |
| 5,677,692 A | * | 10/1997 | Hasegawa .................... 341/161 |
| 5,852,415 A | * | 12/1998 | Cotter et al. ................. 341/120 |
| 6,268,813 B1 | * | 7/2001 | de Wit ......................... 341/120 |
| 6,320,530 B1 | * | 11/2001 | Horie .......................... 341/163 |
| 6,445,331 B1 | * | 9/2002 | Stegers ........................ 341/172 |
| 6,750,800 B2 | * | 6/2004 | Yoshinaga .................... 341/172 |
| 2003/0160714 A1 | | 8/2003 | Yoshinaga |

FOREIGN PATENT DOCUMENTS

| JP | 5-259913 | 10/1993 |
| JP | 3188730 | 5/2001 |

* cited by examiner

Primary Examiner—Brian Young
(74) Attorney, Agent, or Firm—Wenderoth, Lind & Ponack, L.L.P.

(57) ABSTRACT

In a charge redistribution type A/D converter, an input-side capacitor terminal and a comparator-side capacitor terminal are connected through first and second analog switches to a fixed-voltage supply circuit, and the input-side capacitor terminal is connected through a third analog switch to the outside. Immediately before sampling an analog signal, the first and second analog switches are closed while the third analog switch is opened, according to a RESET signal. Thereby, fixed voltages are supplied to the input-side capacitor terminal and the comparator-side capacitor terminal, respectively, and charge stored in a weighting capacitor unit is initialized to a predetermined value.

8 Claims, 14 Drawing Sheets

A/D CONVERTER AND A/D CONVERSION METHOD

FIELD OF THE INVENTION

The present invention relates to an A/D converter and an A/D conversion method and, more particularly, to a charge redistribution type A/D converter and A/D conversion method.

BACKGROUND OF THE INVENTION

Hereinafter, the operation of a conventional charge distribution type A/D converter will be described.

FIG. 9(a) is a block diagram illustrating an example of a conventional charge redistribution type A/D converter which is disclosed in Japanese Published Patent Application No. Hei. 5-259913.

The conventional A/D converter is provided with an analog input terminal 301, an analog reference power supply terminal 302, a controller 201, a comparator 237, a storage register 238, transfer gates 222~232, capacitors 233~236 constituting a capacitor array, inverters 202~206, 208, 217~221, and NAND circuits 207, 209~216. The relative capacitance ratios between the respective capacitors 233 (capacitance C1), 234 (capacitance C2), 235 (capacitance C3), and 236 (capacitance C4) are determined as follows:

$$C1:C2:C3:C4 = 1:\tfrac{1}{2}:\tfrac{1}{4}:\tfrac{1}{8}$$

Next, a description will be given of the operation principle of the conventional charge redistribution type A/D converter, with reference to the block diagram of FIG. 9(a) and the timing charts of operation signals shown in FIG. 9(b).

Initially, during the sampling period, the output levels of control signals S1, S3, S5, S7 and S9 outputted from the controller 201 become "1", whereby the transfer gates 225, 227, 229, 231, and 233 are turned on. On the other hand, the output levels of the control signals S2, S4, S6, and S8, and the output level of the inverter 221 become "0", whereby the transfer gates 224, 226, 228, 230, and 222 are turned off. Then, an analog signal supplied through the analog input terminal 301 is transmitted through the transfer gates 223, 225, 227, 229, and 231, whereby charging or discharging to/from the capacitors 233, 234, 235, and 236 is carried out. Thereby, sampling of the analog value of the analog signal is carried out.

During the holding period that follows the sampling period, the output level of the control signals S1, S3, S5, S7, and S9 become "0", and the transfer gates 225, 227, 229, 231, and 223 are turned off, whereby the charge stored during the sampling period is held by the capacitors 233, 234, 235, and 236. Assuming that the level of the analog signal inputted to the analog input terminal 301 is V1, a voltage V at a comparison line, which is input to the comparator 237 at this time, is represented as follows:

$$V=V1$$

Next, A/D conversion takes place. Initially, in the first state of A/D conversion, the output level of the control signal S3 outputted from the controller 201 becomes "1", and the transfer gate 225 is turned on. Thereby, the level of a reference voltage Vr supplied from the analog reference power supply terminal 302 is applied to an end of the capacitor 233. Since the capacitance C1 of the capacitor 233 is about ½ of the sum of the capacitances of the capacitors C1~C4, the voltage V at the comparison line that is input to the comparator 237 is represented as follows:

$$V=-V1+Vr/2$$

When V<0, the output level of the comparator 237 which is transmitted to the controller 201 becomes "0", and the output level of the control signal S3 outputted from the controller 201 is maintained at "1", whereby the transfer gate 225 remains in the ON state, and the most significant bit is set at "1". Further, when V>0, the output level of the comparator 237 becomes "1", and the output levels of the control signals S2 and S3 outputted from the controller 201 become "1" and "0", respectively, whereby the transfer gate 224 is turned on while the transfer gate 225 is turned off, and the most significant bit is set at "0". In FIG. 9(b), the most significant bit is set at "1" when the output level of the control signal S2 is "0" and the output level of the control signal S3 is "1".

Next, the second bit from the most significant bit is determined. In the controller 201, the output level of the control signal S5 is "1", and the transfer gate 227 is turned on, whereby the voltage V at the comparison line inputted to the comparator 237 becomes a voltage indicated by either of the following two formulae, depending on the state of the predetermined most significant bit.

$$V=-V1+Vr/2+Vr/4 \text{ (the most significant bit is "1")}$$

$$V=-V1+Vr/4 \text{ (the most significant bit is "0")}$$

In the timing charts shown in FIG. 9(b), since the most significant bit is set at "1", the comparison line voltage V is represented as follows:

$$V=-V1+Vr+Vr/4$$

Also in this case, the second bit from the most significant bit is set at "1" when V<0, and it is set at "0" when V>0, by the comparator 237 and the controller 201, as in the case of determining the most significant bit. Hereinafter, a similar procedure is repeated until the least significant bit is determined. When the least significant bit is determined, the analog signal is classified as any of eight states (1111)~(0000). In the timing charts shown in FIG. 9(b), the analog signal is (1100) finally.

Next, in the state where the result of A/D conversion is written in the storage register 238, the result of A/D conversion is written in the storage register 238 through the controller 201. In this state, the level of an END signal that is outputted from the controller 201 and functions as a control signal for the storage register 238 becomes "1", and the result of A/D conversion that is supplied from the controller 201 through the end signal to the storage register 238 is written in the storage register 238. Hereinafter, A/D conversion is repeatedly executed through the above-mentioned operation procedure, i.e., sampling, holding, A/D conversion, and storage into the register.

By the way, when the A/D converter continuously performs two times of 4-bit A/D conversion, there are two cases where the converted value changes from (0000) to (1111) and where it changes from (1111) to (1111). In the latter case, the capacitor must be fully charged from the state where it is not charged at all, in contrast to the former case. Therefore, the charging/discharging current excessively flows through the analog input terminal 301.

Therefore, particularly when the analog input terminal 301 is connected at high impedance, extra charging time for the capacitor is required. However, the sampling time is limited to the limited conversion time, and the charging/discharging time for the capacitor is in reverse proportion to a time constant of CR, and therefore, a resistance value that can be connected to the analog input terminal 301 is also limited.

However, in the conventional A/D converter shown in FIG. 9(a), reduction in sampling time is realized by using a technique described hereinafter, as a countermeasure against the above-mentioned limitations.

That is, in the state where A/D conversion is completed and the result of conversion is written in the storage register 238, the level of the END signal outputted from the controller 201 changes from "0" to "1", and the result of A/D conversion is written in the storage register 238 under control of the END signal. Further, the output level of the inverter 206 changes from "1" to "0", and the output levels of the NAND circuit 207 and 209~216 become "1", whereby the respective transfer gates 223, 224, 227, 229, 231, and 232 are turned off by the inversion functions of the inverters 208 and 217~221. In this case, the total charge amount Q in the capacitors 233~236 is initialized as follows.

$$Q = C1 \cdot Vr$$

Therefore, during sampling in the next A/D conversion that follows the previous A/D conversion, all of the transfer gates 223, 225, 227, 229, 231, and 232 are turned on, and a voltage level Vo in the B line at the start of sampling is given as follows.

$$Vo = Vr \cdot C1/(C1+C2+C3+C4) = Vr/2$$

Accordingly, during sampling for the analog voltage applied to the analog input terminal 301 with respect to the capacitors 233~236, since charging or discharging from the level of Vr/2 is constantly carried out regardless of the amount of charge that is sampled and held during the previous conversion, the length of the sampling period can be reduced to ½.

FIG. 9(c) is a block diagram illustrating another example of a conventional charge redistribution type A/D converter.

As shown in FIG. 9(c), the conventional A/D converter is provided with an analog input terminal 303, an analog reference power supply terminal 304, a controller 201, inverters 206, 208, 221, and 239, NAND circuits 207 and 240~263, transfer gates 222~232, capacitors 233~236 constituting a capacitor array, a comparator 237, a storage register 238, an initial value setting register 264, and a decoder 265. As in FIG. 9(a), the relative capacitance ratios between the respective capacitors 233 (capacitance C1), 234 (capacitance C2), 235 (capacitance C3), and 236 (capacitance C4) are determined as follows:

$$C1:C2:C3:C4 = 1:½:¼:⅛$$

Further, FIG. 9(d) illustrate timing charts indicating operation signals in FIG. 9(c).

Hereinafter, a description will be given of the operation of the conventional A/D converter with reference to the block diagram of FIG. 9(c) and timing charts of operation signals shown in FIG. 9(d).

As for the timings of the control signals S1~S9 and the END signal which are outputted from the controller 201, these signals change as in the above-mentioned conventional A/D converter. During sampling, holding, and A/D conversion, the level of the END signal is "0". Accordingly, the output level of the inverter 206 is "1", and thereby the NAND circuits 256~263 invert the output levels of the NAND circuits 240~247 and output the inverted output levels, respectively. As a result, the output levels of the control signals S1~S9 supplied from the controller 201 are outputted as they are. Accordingly, gate control for the transfer gates 224~231 connected to the capacitors 233~236 is carried out according to the control signals S1~S9 outputted from the controller 201, as described for FIG. 9(a). Further, since gate control for the transfer gates 222 and 223 is carried out in like manner as described for FIG. 9(a), the series of operations from sampling to A/D conversion are carried out in the same procedure as described for FIG. 9(a).

The prior art shown in FIG. 9(c) differs from the prior art shown in FIG. 9(a) in the following points. When A/D conversion is completed, writing of the result of conversion into the storage register 238 takes place, and the level of the END signal outputted from the controller 201 changes from "0" to "1". Then, the result of conversion supplied from the controller 201 to the storage register 238 is written in the storage register 238, and the output level of the inverter 206 changes from "1" to "0", and thereby all of the output levels of the NAND circuits 207 and 240~247 become "1". As a result, the output level of the inverter 208 changes from "1" to "0", and the output level of the inverter 239 changes from "0" to "1", whereby the output levels of the NAND circuits 248~255 are determined by the output of the decoder 265, i.e., the set value outputted from the initial value setting register 264.

As described above, the initial value setting register 264 enables the initial value setting register 264 to selectively set the amounts of initial charges to the capacitors 233~236, i.e., the voltages of the capacitors 233~236 at starting of sampling.

The initial set voltage may be arbitrarily determined within the minimum width of A/D conversion accuracy.

However, the prior arts described with reference to FIGS. 9(a) and 9(b) need many inverters and gates for setting the initial voltage, and the numbers of inverters and gates dramatically increase as the number of bits of the A/D converter increases. Further, the degree of freedom in setting the initial voltage is low.

SUMMARY OF THE INVENTION

The present invention is made to solve the above-mentioned problems and has for its object to provide an apparatus and a method for performing charge redistribution type A/D conversion, which enables initialization of charges stored in capacitors, at a high degree of freedom, by using a small-scale circuit, while maintaining A/D conversion accuracy, thereby to achieve a high-speed and low-power-consumption A/D converter.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, there is provided a charge redistribution type A/D converter for converting an input analog signal into an output digital signal, and the A/D converter includes an initialization circuit for initializing electric charge stored in a capacitor, immediately before sampling the input analog signal. Therefore, it is not necessary to enhance the capability of a chopper comparator to maintain conversion accuracy, thereby realizing a high-speed and low-power-consumption A/D converter while maintaining conversion accuracy.

According to a second aspect of the present invention, in the A/D converter according to the first aspect, an input-side capacitor terminal and a comparator-side capacitor terminal of the capacitor are connected to a fixed voltage supply circuit through first and second analog switches, respectively; the input-side capacitor terminal is connected to the outside through a third analog switch; and the first and second analog switches are closed and the third analog switch is opened immediately before sampling the input analog signal, whereby fixed voltages are supplied to the input-side capacitor terminal and to the comparator-side capacitor terminal, respectively, to initialize the charge stored in the capacitor to a predetermined value. Therefore, it is not necessary to increase the capability of the chopper comparator to maintain conversion accuracy, and thereby a high-speed and low-power-consumption A/D converter is realized while maintaining conversion accuracy, by only adding a few circuits for capacitor initialization.

According to a third aspect of the present invention, in the A/D converter according to the second aspect, the fixed voltage supply circuit is a circuit for supplying fixed voltages obtained by predetermined voltage division using resistors. Therefore, it is not necessary to increase the capability of the chopper comparator to maintain conversion accuracy, and thereby a high-speed and low-power-consumption A/D converter is realized while maintaining conversion accuracy, by only providing a line of fixed resistors as a fixed voltage supply surface for capacitor initialization.

According to a fourth aspect of the present invention, in the A/D converter according to the second aspect, the fixed voltage supply circuit comprises a source follower using an operation amplifier. Therefore, it is not necessary to increase the capability of the chopper comparator to maintain conversion accuracy, and thereby a high-speed and low-power-consumption A/D converter is realized while maintaining conversion accuracy, by only adding a source follower as a fixed voltage supply circuit for capacitor initialization.

According to a fifth aspect of the present invention, in the A/D converter according to the second aspect, the fixed-voltage supply circuit comprises an inverter circuit. Therefore, it is not necessary to increase the capability of the chopper comparator to maintain conversion accuracy, and thereby a high-speed and low-power-consumption A/D converter is realized while maintaining conversion accuracy, by only adding an inverter circuit as a fixed voltage supply circuit for capacitor initialization.

According to a sixth aspect of the present invention, in the A/D converter according to the second aspect, the fixed-voltage supply circuit comprises a chopper comparator in the auto-zero state. Therefore, it is not necessary to increase the capability of the chopper comparator to maintain conversion accuracy, and the circuit scale hardly increases because the already-existing auto-zero chopper comparator is used as a fixed voltage supply circuit for capacitor initialization, thereby realizing a high-speed and low-power-consumption A/D converter while maintaining conversion accuracy.

According to a seventh aspect of the present invention, in the A/D converter according to the second aspect, the fixed voltage supply circuit comprises a reference resistor. Therefore, it is not necessary to increase the capability of the chopper comparator to maintain conversion accuracy, and the circuit scale hardly increases because the already-existing reference resistor is used as a fixed voltage supply circuit for capacitor initialization, thereby realizing a high-speed and low-power-consumption A/D converter while maintaining conversion accuracy.

According to an eighth aspect of the present invention, the A/D converter according to the first aspect further includes a multiplexer for selecting one of a plurality of analog signals to be input to the initialization circuit, and a timing generation circuit for generating timing signals to be supplied to the core of the A/D converter, the initialization circuit, and the multiplexer; when the signal selected by the multiplexer is switched to another signal, the timing generation circuit generates a reset signal immediately before sampling the analog signal; and the charge stored in the capacitor is initialized to a predetermined value, thereby performing A/D conversion that is independent of the previous amount of charge. Therefore, even in the A/D converter to which an analog signal is selectively input through the multiplexer, it is not necessary to enhance the capability of the chopper comparator to maintain conversion accuracy, thereby realizing a high-speed and low-power-consumption A/D converter while maintaining conversion efficiency.

According to a ninth aspect of the present invention, the A/D converter according to the first aspect further includes a timing generation circuit for generating timing signals to be supplied to the core of the A/D converter and the initialization circuit; wherein, a change in the amount of charge stored in the capacitor is large immediately after power on, the timing generation circuit generates a reset signal immediately before sampling the input analog signal; and the charge stored in the capacitor is initialized to a predetermined value, thereby performing A/D conversion. Therefore, it is not necessary to enhance the capability of the chopper comparator to maintain conversion efficiency, thereby realizing a high-speed and low-power-consumption A/D converter while maintaining conversion accuracy.

According to a tenth aspect of the present invention, there is provided an A/D conversion method for converting an input analog signal into an output digital signal by using a charge redistribution type A/D converter, and the method includes a reset step of setting electric charge stored in a switching capacitor group to a predetermined initial value immediately before sampling the input analog signal. Therefore, it is possible to obtain an A/D conversion method that realizes a high-speed and low-power-consumption A/D converter while maintaining conversion accuracy.

As described above, in the charge redistribution type A/D converter according to the present invention, electric charge stored in a capacitor immediately before sampling is initialized to a predetermined value, at a high degree of freedom, by only adding a small-size circuit. Therefore, the electric charge can be initialized at a higher degree of freedom than in the case where the initial value is set at zero level, or ½ of the reference voltage, or the minimum width of A/D conversion accuracy, whereby responsivity to the input signal is improved. As a result, a high-speed and low-power-consumption A/D converter is realized while maintaining conversion efficiency, by only increasing the circuit scale a little.

DETAILED DESCRIPTION OF THE PREFERRED EMBODIMENTS

Figure 1A:
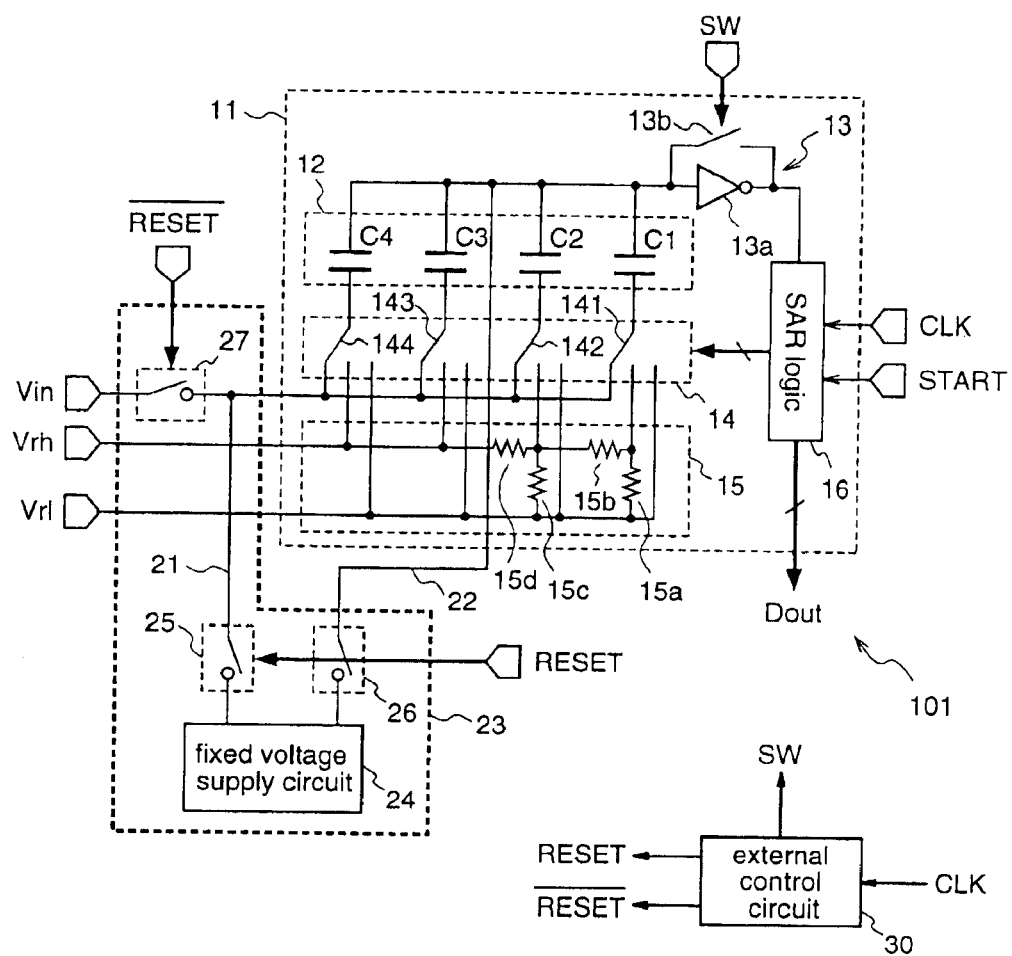
FIG. 1(a) is a circuit diagram illustrating the construction of a charge redistribution type A/D converter according to a first embodiment of the present invention.

Hereinafter, embodiments of the present invention will be described with reference to drawings.

FIGS. 1~6 are block diagrams illustrating the constructions of charge redistribution type A/D converters each having a resolution of 4 bits.

Each of the charge redistribution type A/D converters 101~106 performs A/D conversion for an analog signal inputted from an input terminal Vin to output digital codes D1~D4 from an output terminal Dout.

The A/D converter 11 comprises a weighting capacitor group 12, a chopper comparator 13, an input switch group 14, a reference resistor 15, a SAR (Successive Approximation Register) logic circuit 16, and an external control circuit 30.

It is assumed that capacitors C1 to C4 constituting the weighting capacitor group 12 have capacitance ratios as follows:

$$C1:C2:C3:C4 = 1/4 : 1/4 : 1/2 : 1$$

The chopper comparator 13 comprises an inverter 13a and an analog switch 13b, and the input switch group 14 comprises input switches 141 to 144 corresponding to the capacitors C1 to C4. The reference resistor 15 comprises resistors 15a to 15d that are connected like a rudder, wherein weighting is realized by voltage division so that the weights on the lower two bits of the weighting capacitor group 12 are equalized to enhance accuracy.

The external control circuit 30 generates a RESET signal and a /RESET signal for turning on/off analog switches 25 to 27 shown in FIG. 1(a), and generates a SW signal for turning on/off a switch 13b included in the chopper comparator 13.

Figure 1B:
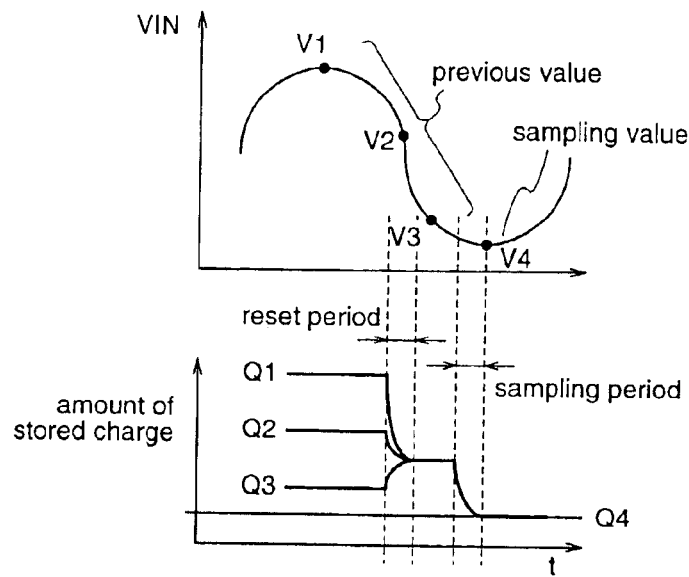
FIG. 1(b) is a diagram for explaining the capacitor initialization operation of the A/D converter.
Figure 1C:
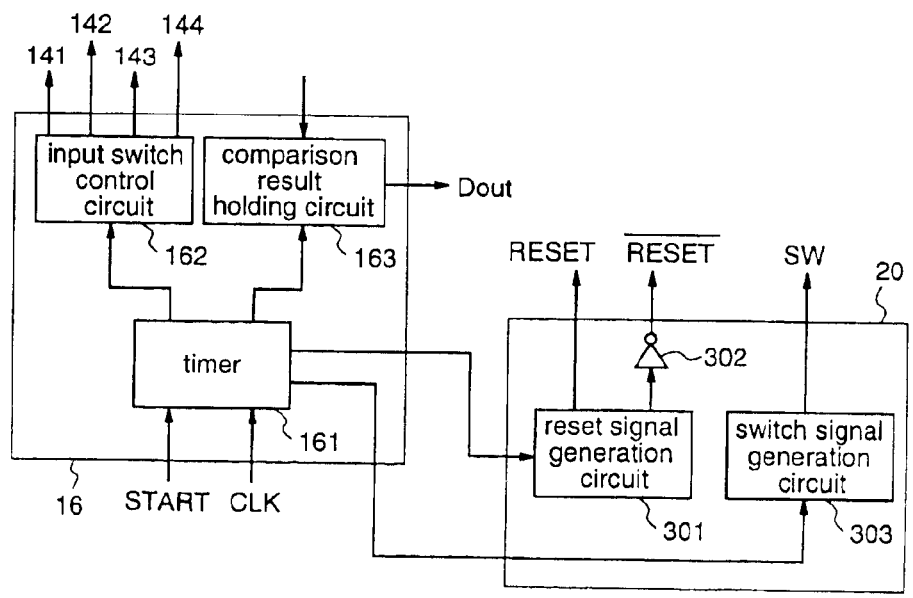
FIG. 1(c) is a diagram illustrating the internal construction of a SAR logic.

FIG. 1(c) illustrates internal structures of the SAR logic circuit 16 and the external control circuit 30 shown in FIG. 1(a). The SAR logic circuit 16 includes a timer 161, an input switch control circuit 162, and a comparison result holding circuit 163. The timer 161 starts counting on receipt of a START signal and a CLK signal. The input switch control circuit 162 is started by the timer 161, and successively turns on the input switches 141 to 144 one by one. The comparison result holding circuit 163 holds the result of comparison of the chopper comparator 13, bit by bit, and performs serial-to-parallel conversion to output a four-bit Dout signal to the outside. Further, the external control circuit 30 comprises a reset signal generation circuit 301, an inverter 302, and a switch signal generation circuit 303. The reset signal generation circuit 301 generates a reset signal RESET (hereinafter referred to as a RESET signal) under control of the timer 161. The inverter circuit 302 generates an inverted reset signal /RESET (hereinafter referred to a /RESET signal). The switch signal control circuit generates a switch signal SW for the chopper comparator 13 under control of the timer 161.

Figure 1D:
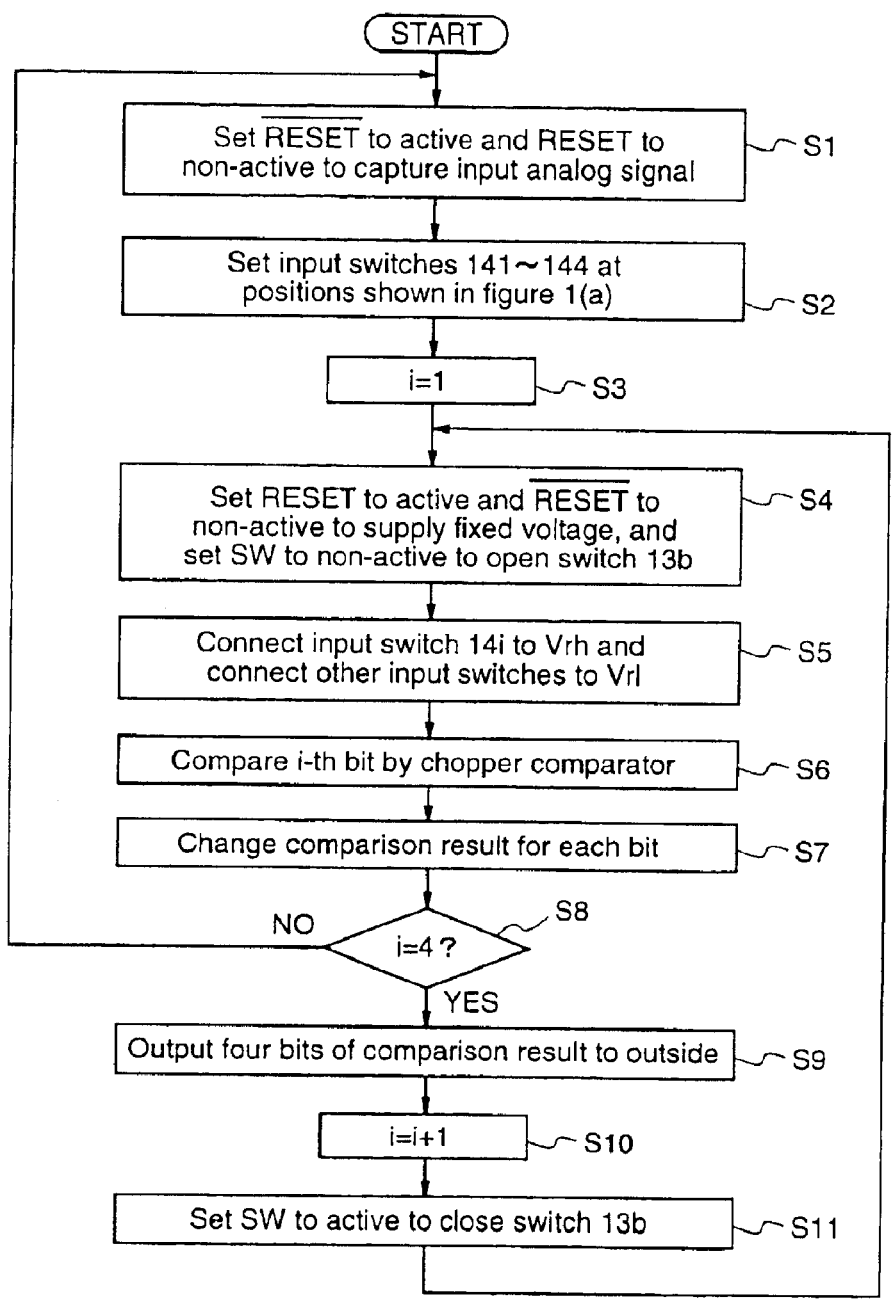
FIG. 1(d) is a flowchart illustrating the control operations of the SAR logic and an external control circuit.

FIG. 1(d) is a flowchart illustrating an A/D conversion method that is realized under control of the SAR logic circuit 16 and the external control circuit 30 shown in FIG. 1(a).

Next, the operations of the charge redistribution type A/D converters 101 to 106 will be described.

Initially, the input switches 141 to 144 are placed at the switch positions shown in FIG. 1(a) by the SAR logic circuit 16 (refer to step S1 in FIG. 1(d)), and an analog input voltage Vin is supplied to all of the weighting capacitors C1 to C4 (refer to step S2).

Next, the position of the input switch 144 is changed so as to give a comparison voltage Vrh to only an input terminal of the capacitor C4 on which the heaviest weight is applied. A comparison voltage Vrl is given to the remaining capacitors C3, C2, and C1 through the input switches 143, 142, and 141, and the polarity of voltage change that appears at a common terminal of the capacitors C1 to C4 is determined by the chopper comparator 13. The result of determination is the MSB (Most Significant Bit) of the A/D converted value (refer to steps S2 to S7).

Next, the position of the input switch 143 is changed so as to give the comparison voltage Vrh to only the capacitor C3, and the comparison voltage Vrl is given to the capacitors C4, C2, and C1 through the input switches 144, 142, and 141 (refer to steps S7 to step S5), and the polarity of voltage change that appears at the common terminal of the capacitors C1 to C4 is determined by the chopper comparator 13. The result of determination is the second bit from the MSB of the A/D converted value.

Thereafter, the remaining capacitors are successively processed in similar manner in descending order of weight, thereby determining the values of the respective bits serially, i.e., in descending order of significance. Since, during comparison, voltage is applied to only one end of the capacitor, the total amount of charge stored during sampling is maintained, that is, only the amounts of charges distributed to the respective capacitors are interchanged. Accordingly, if the amount of charge stored during sampling is insufficient, it is impossible to make up for this shortage by the subsequent operation, resulting in a fatal error.

Further, each of the A/D converters 101 to 106 is provided with, in addition to an A/D converter core 11, a charge initialization circuit 23 comprising first, second, and third analog switches 25, 26, and 27, and a fixed voltage supply circuit 24. Immediately before sampling of the input analog signal, a RESET signal is supplied from the external control circuit 30 to the first and second analog switches 25 and 26, and an /RESET signal is supplied to the third analog switch 27, thereby initializing the charge stored in the switching capacitor group 12. Further, the analog switch 13b of the chopper comparator 13 is also turned on/off by the external control circuit 30.

[Embodiment 1]

FIG. 1(a) is a block diagram illustrating a charge redistribution type A/D converter according to a first embodiment of the present invention.

The charge redistribution type A/D converter 101 shown in FIG. 1(a) is provided with an initialization circuit 23 for initializing the weighting capacitor group 12 (capacitors), and the initialization is carried out by a fixed-voltage supply circuit 24 included in the initialization circuit 23.

In the charge redistribution type A/D converter 101 according to the first embodiment, an input-side capacitor terminal 21 and a comparator-side capacitor terminal 22 are connected to the fixed voltage supply circuit 24 through the first and second analog switches 25 and 26, respectively, and the input-side capacitor terminal 21 is connected to an external input analog signal terminal Vin through the third analog switch 27. Immediately before sampling the input analog signal Vin, the first and second analog switches 25 and 26 are closed and, simultaneously, the third analog switch 27 is opened by a RESET signal from the external control circuit 30.

Therefore, fixed voltages are supplied to the input-side capacitor terminal 21 and the comparator-side capacitor terminal 22, respectively, whereby the charge stored in the weighting capacitor group 12 can be initialized to a predetermined value according to the fixed voltages. As a result, it is possible to perform initial setting of the charge stored in the capacitors in the charge redistribution type A/D converter, as shown in FIG. 1(b). In the case shown in FIG. 1(b), assuming that there is no initialization circuit, the charge amount Q1 must be significantly decreased to Q4 during the sampling period, and therefore, great discharging ability is required of the chopper comparator to realize such decrease. In this first embodiment, however, since the charge amount Q1 has previously been reduced to an intermediate value between Q2 and Q3 during the reset period, it is easy to reduce the charge amount to Q4 during the sampling period. Therefore, when the analog input changes significantly, the A/D converter can easily follow the change in the analog input, even though the sampling period is shortened and the capability of the chopper comparator is degraded. Thereby, the conversion accuracy of the A/D conversion result can be maintained independently of the previous sampling value.

Thus, according to the first embodiment, the charge redistribution type A/D converter is provided with the fixed voltage supply circuit, and the charges stored in the capacitors constituting the weighting capacitor group are initialized by a fixed voltage generated by the fixed voltage supply circuit, during a period from when the previous A/D conversion is completed to when the next A/D conversion is started. Therefore, it is not necessary to enhance the capability of the chopper comparator to maintain the A/D conversion accuracy, whereby speedup and low power consumption can be achieved while maintaining the A/D conversion accuracy.

Further, in this first embodiment, only a fixed voltage supply circuit and a few analog switches must be newly added for capacitor initialization, and control as to whether a fixed voltage is to be supplied or not is carried out by only two signals, i.e., a reset signal and an inverted signal thereof.

Therefore, there is only a slight increase in the circuit area even when the devices are integrated.

[Embodiment 2]

Figure 2:
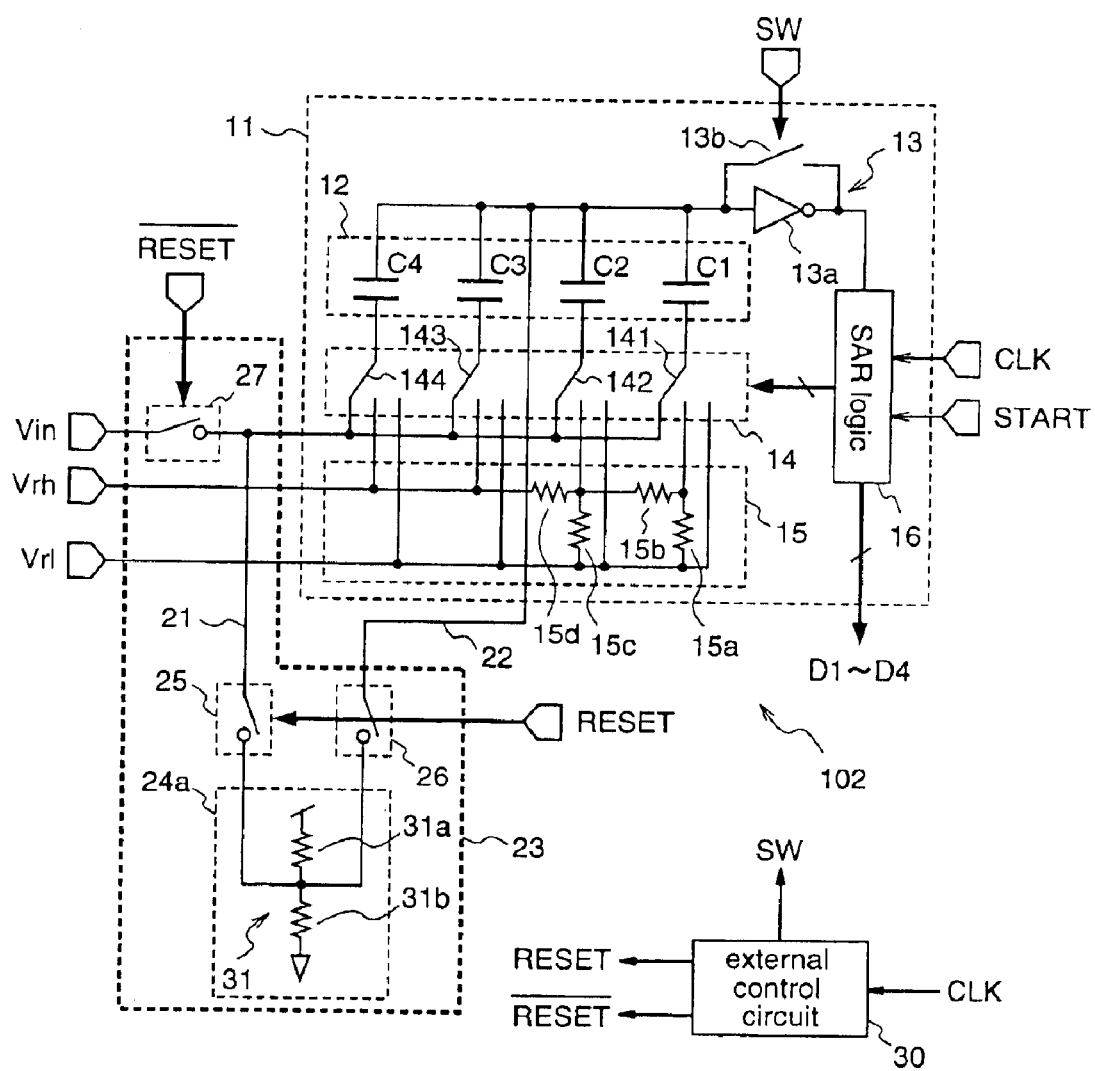
FIG. 2 is a circuit diagram illustrating the construction of a charge redistribution type A/D converter according to a second embodiment of the present invention.

FIG. 2 is a block diagram illustrating a charge redistribution type A/D converter 102 according to a second embodiment of the present invention.

The charge redistribution type A/D converter 102 according to the second embodiment has a fixed voltage supply circuit 24a implemented by a series resistance line 31, and a voltage which is divided by resistors included in the series resistance line 31 is supplied to the first and second analog switches 25 and 26.

The charge redistribution type A/D converter 102 constituted as described above supplies the divided voltage to each of the input-side capacitor terminal 21 and the comparator-side capacitor terminal 22 immediately before sampling of the input analog signal, and the charge stored in the weighting capacitor group 12 is initialized according to the value of the divided voltage. This initial value can be set to a predetermined value by changing the resistance ratio between the two resistors 31a and 31b constituting the series resistance line 31.

As a result, even when the analog input changes significantly, the conversion accuracy of the A/D conversion result can be maintained independently of the previous sampling value, although the sampling period is shortened and the capability of the chopper comparator is degraded.

As described above, according to the second embodiment, the series resistance line is provided as a fixed voltage supply circuit, and the charges stored in the capacitors constituting the weighting capacitor group are initialized according to a fixed voltage generated by voltage division using the series resistance line, during a period from when the previous A/D conversion is completed to when the next A/D conversion is started. Therefore, it is not necessary to enhance the capability of the chopper comparator to maintain the A/D conversion accuracy, whereby speedup and low power consumption are achieved while maintaining the A/D conversion accuracy.

Further, in this second embodiment, only a series resistance line and a few analog switches must be newly added for capacitor initialization, and control as to whether a fixed voltage is to be supplied or not is carried out by only two signals, i.e., a reset signal and an inverted signal thereof. Therefore, there is only a slight increase in the circuit area even when the devices are integrated.

[Embodiment 3]

Figure 3:
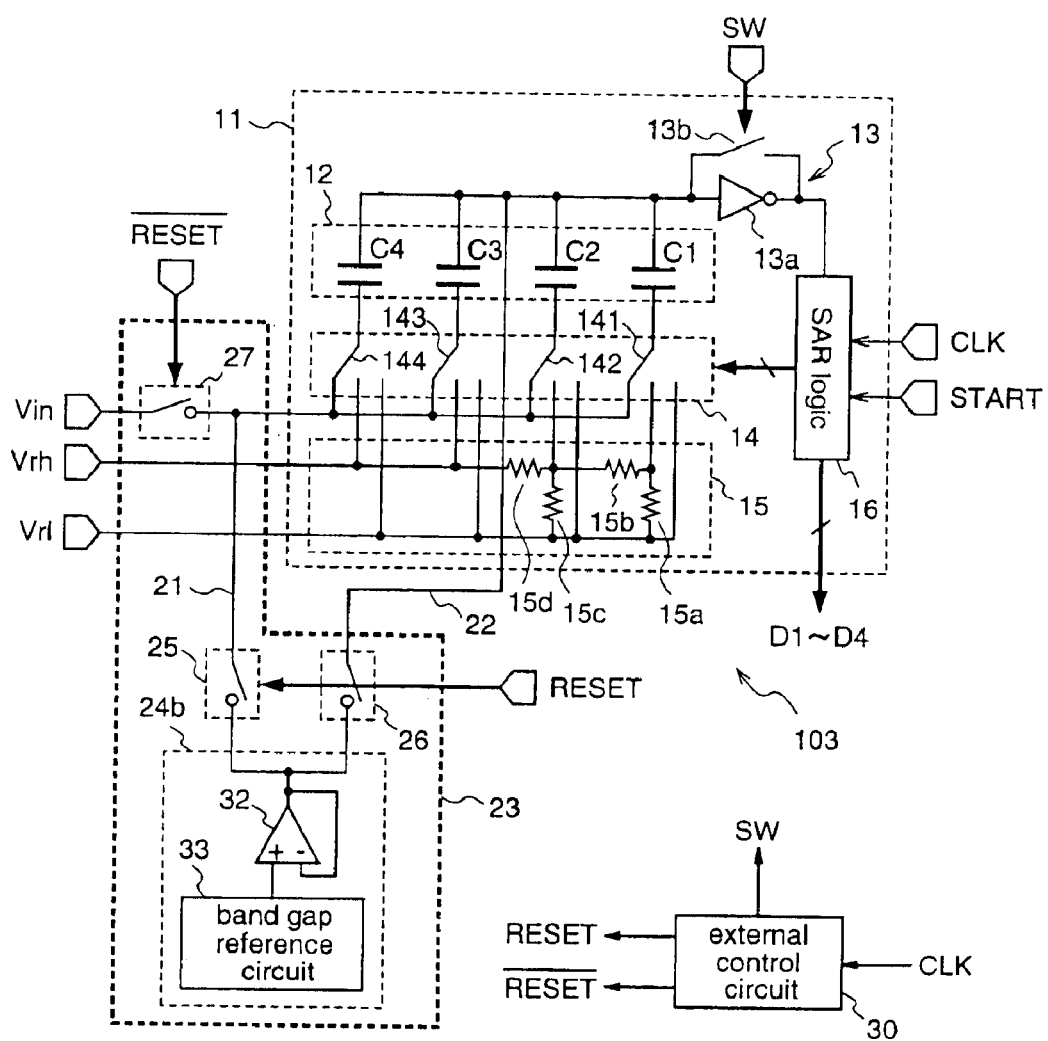
FIG. 3 is a circuit diagram illustrating the construction of a charge redistribution type A/D converter according to a third embodiment of the present invention.

FIG. 3 is a block diagram illustrating a charge redistribution type A/D converter according to a third embodiment of the present invention.

In a charge redistribution type A/D converter 103 according to the third embodiment shown in FIG. 3, a fixed voltage supply circuit 24b comprises a source follower circuit 32 using an operation amplifier, and a band gap reference circuit 33, and a reference voltage driven by the source follower circuit 32 is supplied to first and second analog switches 25 and 26.

In the charge redistribution type A/D converter 103 according to the third embodiment, the reference voltage that is driven by the source follower circuit 32 is supplied to the input-side capacitor terminal 21 and the comparator-side capacitor terminal 22, respectively, immediately before sampling an analog signal, whereby the charges stored in the weighting capacitor group 12 can be initialized according to the value of the reference voltage. This initial value can be set to an arbitrary value by changing an operation point of the operation amplifier as a component of the source follower circuit 32.

As a result, although the sampling period is shortened and the capability of the chopper comparator is degraded, the conversion accuracy of the A/D conversion result can be maintained independently of the previous sampling value even when the analog input changes significantly.

As described above, according to the third embodiment, a fixed voltage supply circuit comprising a band gap reference circuit and a source follower circuit is provided, and the charges of the capacitors constituting the weighting capacitor group are initialized by a fixed voltage as a reference voltage that is driven by the source follower circuit during a period from when the previous A/D conversion is completed to which the next A/D conversion is started. Therefore, it is not necessary to enhance the capability of the chopper comparator to maintain the A/D conversion accuracy, resulting in speedup and low power consumption while maintaining the A/D conversion accuracy.

Further, in this third embodiment, only a band gap reference circuit, a source follower circuit, and a few analog switches must be newly added for capacitor initialization, and control as to whether a fixed voltage is to be supplied or not is carried out by only two signals, i.e., a reset signal and an inverted signal thereof. Therefore, there is only a slight increase in the circuit area even when the devices are integrated.

[Embodiment 4]

Figure 4:
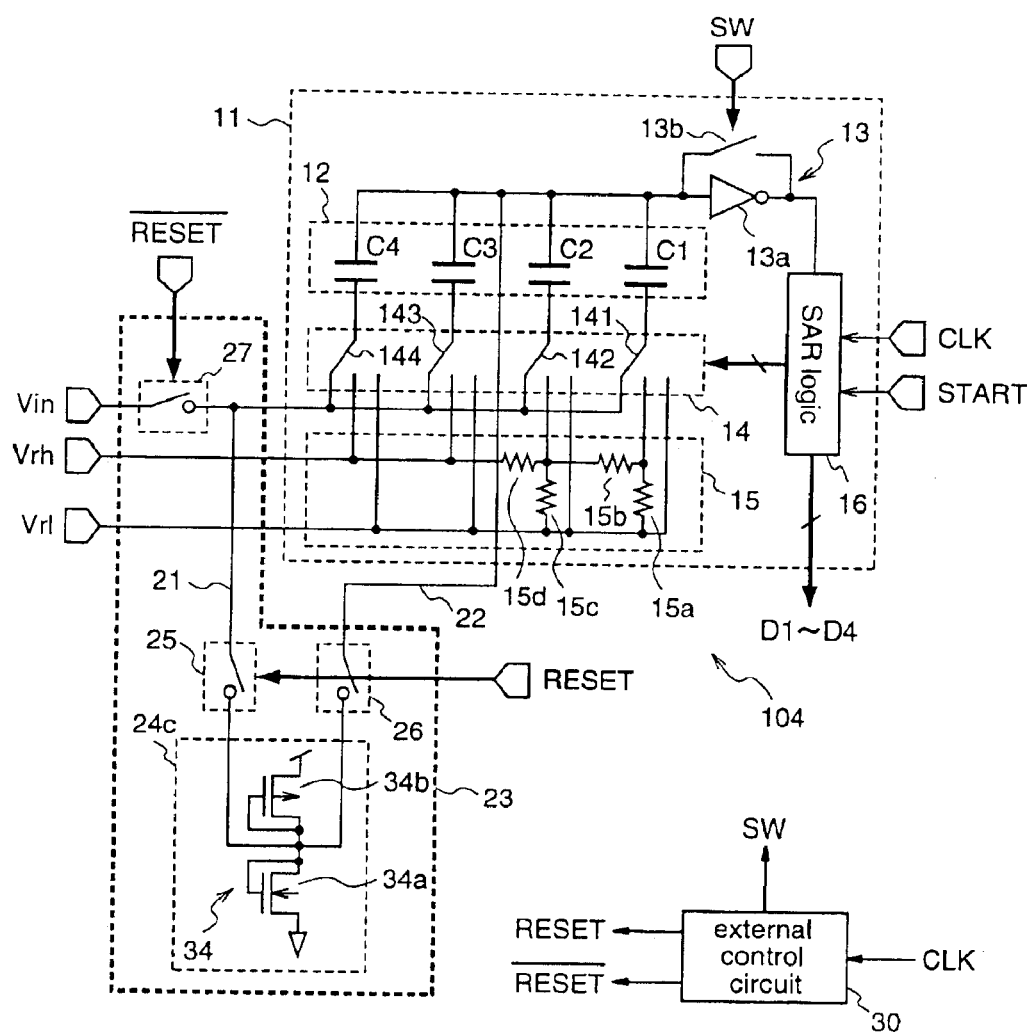
FIG. 4 is a circuit diagram illustrating the construction of a charge redistribution type A/D converter according to a fourth embodiment of the present invention.

FIG. 4 shows a charge redistribution type A/D converter 104 according to a fourth embodiment of the present invention.

The charge redistribution type A/D converter 104 according to the fourth embodiment shown in FIG. 4 has a fixed voltage supply circuit 24c comprising an inverter circuit 34 whose input and output are short-circuited, and the threshold voltage of the inverter circuit 34 is supplied to the first and second analog switches 25 and 26, respectively.

In the charge redistribution type A/D converter 104 constructed as described above, a threshold voltage of the inverter circuit 34 whose input and output are short-circuited is supplied to the input-side capacitor terminal 21 and the comparator-side capacitor terminal 22, respectively, immediately before sampling an input analog signal, and the charge stored in the weighting capacitor group 12 is initialized according to the value of the threshold voltage. This initial value can be set at a predetermined value by changing the sizes of the two transistors 34a and 34b constituting the inverter circuit 34.

As a result, although the sampling period is shortened and the capability of the chopper comparator is degraded, the conversion accuracy of the A/D conversion result can be maintained independently of the previous sampling value even when the analog input changes significantly.

As described above, according to the fourth embodiment, the inverter circuit whose input and output are short-circuited is provided as a fixed voltage supply circuit, and the charges stored in the capacitors constituting the weighting capacitor group are initialized by a fixed voltage as a threshold voltage of the inverter circuit during a period from when the previous A/D conversion is completed to when the next A/D conversion is started. Therefore, it is not necessary to increase the capability of the chopper comparator to maintain the A/D conversion precision as described for the first embodiment, thereby achieving speedup and low power consumption while maintaining the A/D conversion accuracy.

Further, in this fourth embodiment, only an inverter circuit and a few analog switches must be newly added for capacitor initialization, and control as to whether a fixed voltage is to be supplied or not is carried out by only two signals, i.e., a reset signal and an inverted signal thereof. Therefore, there is only a slight increase in the circuit area even when the devices are integrated.

[Embodiment 5]

Figure 5:
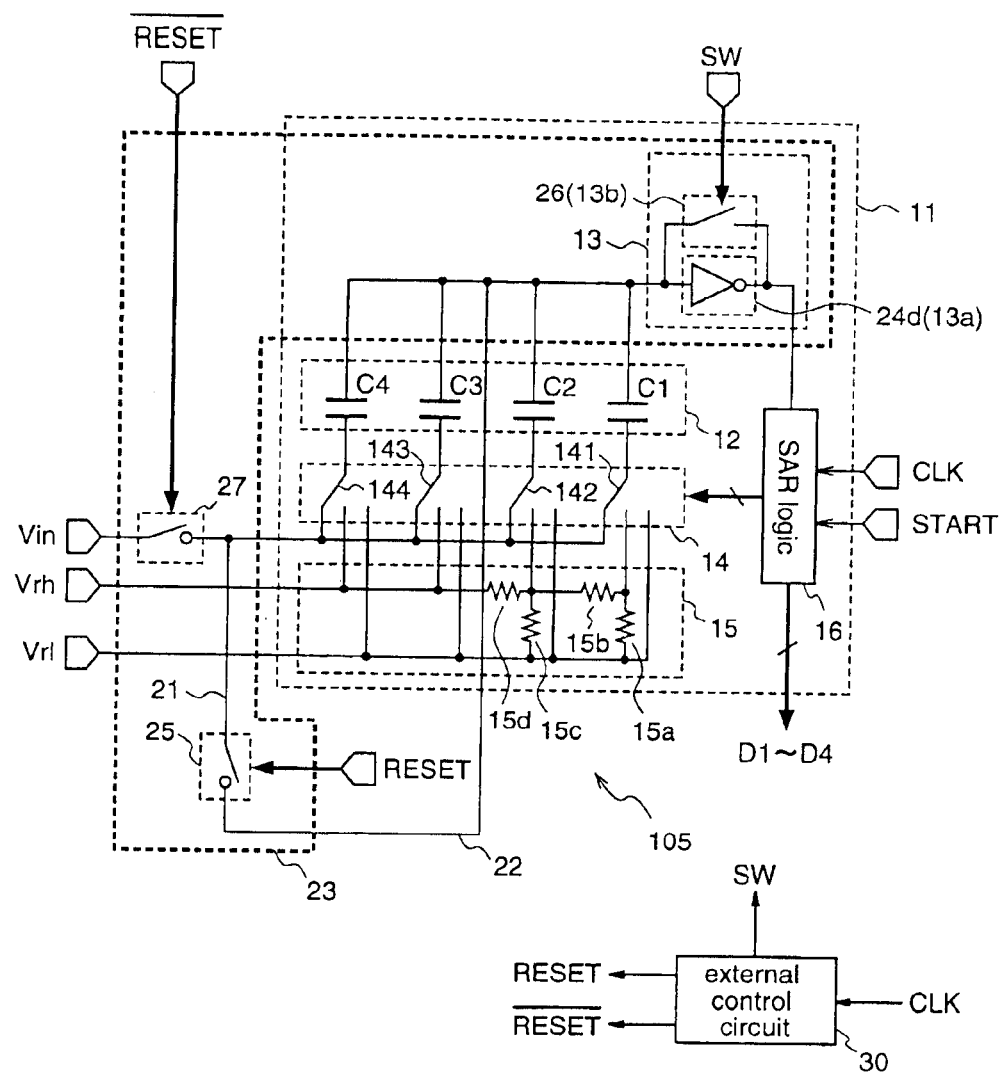
FIG. 5 is a circuit diagram illustrating the construction of a charge redistribution type A/D converter according to a fifth embodiment of the present invention.

FIG. 5 shows a charge redistribution type A/D converter 104 according to a fifth embodiment of the present invention.

The charge redistribution type A/D converter 105 according to the fifth embodiment shown in FIG. 5 uses the chopper comparator 13 also as a fixed voltage supply circuit 24d, and an auto zero voltage of the chopper comparator 13 is supplied to the first analog switch 25 and to the second analog switch 26 that serves also as an auto zero switch of the chopper comparator 13.

In the charge redistribution type A/D converter 105 constructed as described above, an auto zero voltage of the chopper comparator 13, i.e., a threshold voltage of the chopper comparator 13 in the auto zero state where the analog switch 13b is turned on (=the input or output voltage of the chopper comparator 13), is supplied to the input-side capacitor terminal 21 and the comparator-side capacitor terminal 22, respectively, immediately before sampling an input analog signal, and the charge stored in the weighting capacitor group 12 is initialized according to the value of the auto zero voltage. This initial value can be set to a predetermined value by changing the sizes of the two transistors constituting the inverter circuit 13a.

As a result, although the sampling period is shortened and the capability of the chopper comparator is degraded, the conversion accuracy of the A/D conversion result can be maintained independently of the previous sampling value even when the analog input changes significantly.

As described above, according to the fifth embodiment, the chopper comparator is also used as a fixed voltage supply circuit, and the charges stored in the capacitors constituting the weighting capacitor group are initialized by a fixed voltage as a threshold voltage of the inverter circuit constituting the chopper comparator, during a period from when the previous A/D conversion is completed to when the next A/D conversion is started. Therefore, it is not necessary to enhance the capability of the chopper comparator to maintain the A/D conversion precision as described for the first embodiment, thereby achieving speedup and low power consumption while maintaining the A/D conversion accuracy.

Further, in this fifth embodiment, since the originally provided chopper comparator 13 is used as the fixed voltage supply circuit 24d, it is not necessary to add a new circuit other than a few analog switches for capacitor initialization, and control as to whether a fixed voltage is to be supplied or not is carried out by only two signals, i.e., a reset signal and an inverted signal thereof. Therefore, the circuit area hardly increases even when the devices are integrated.

[Embodiment 6]

Figure 6:
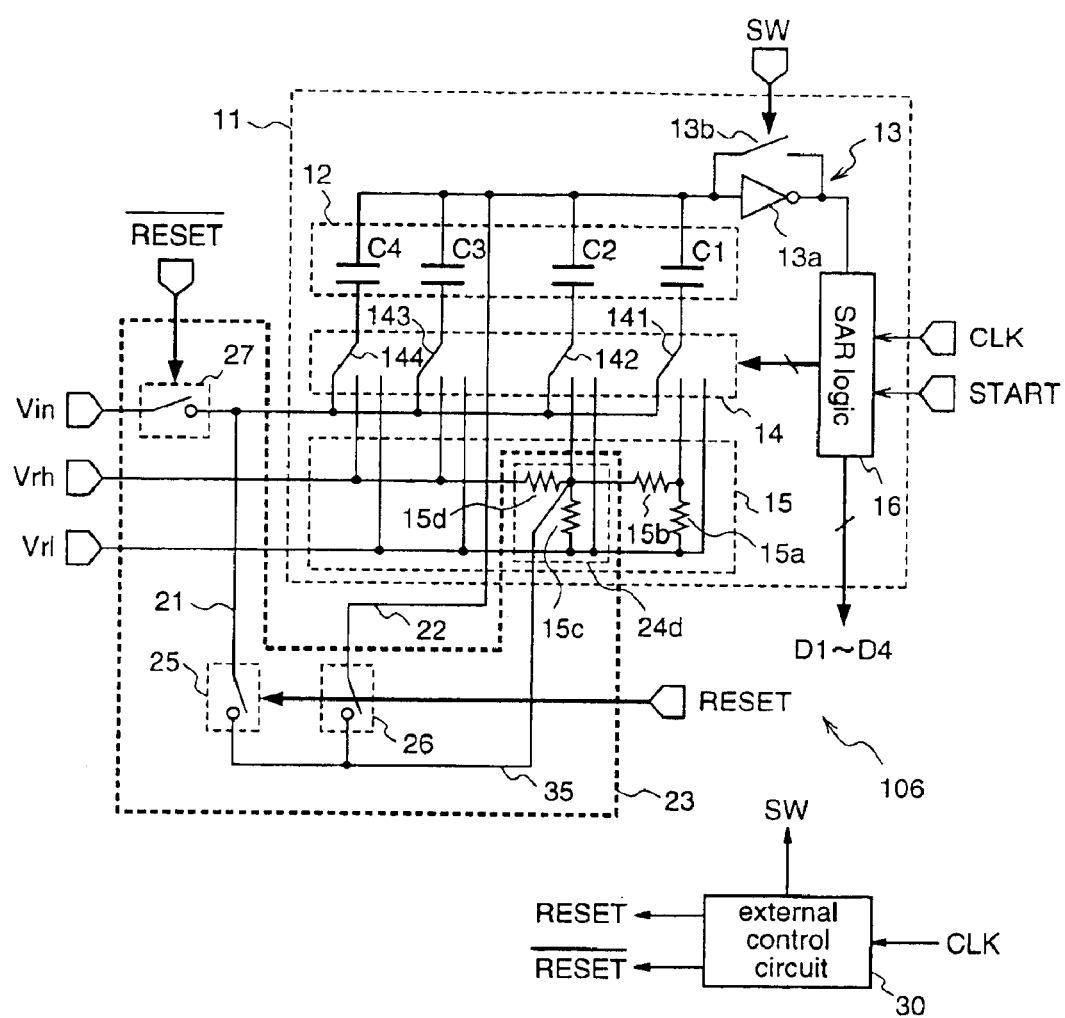
FIG. 6 is a circuit diagram illustrating the construction of a charge redistribution type A/D converter according to a sixth embodiment of the present invention.

FIG. 6 is a block diagram illustrating a charge redistribution type A/D converter according to a sixth embodiment of the present invention.

A charge redistribution type A/D converter 106 shown in FIG. 6 employs, as a fixed voltage supply circuit 24d, resistance division using part of resistors constituting a reference resistor 15, and an intermediate voltage 35 generated by the resistance division is supplied to the first and second analog switches 25 and 26.

This charge redistribution type A/D converter 106 constructed as described above supplies a reference intermediate voltage 35 to the input-side capacitor terminal 21 and the comparator-side capacitor terminal 22, respectively, immediately before sampling an input analog signal, and the charge stored in the weighting capacitor group 12 is initialized according to the value of the reference intermediate voltage 35. This initial value can be set to a predetermined value by inputting the same not from the connection node between the resistors 15c and 15d shown in FIG. 6 but from an appropriate node in the reference resistor 15. This node may be a node outside the reference resistor 15.

As a result, although the sampling period is shortened and the capability of the chopper comparator is degraded, the conversion accuracy of the A/D conversion result can be maintained independently of the previous sampling value even when the analog input changes significantly.

As described above, according to the sixth embodiment, the resistance division using part of the resistors constituting the reference resistor 15 is employed as a fixed voltage supply circuit, and the charges stored in the capacitors constituting the weighting capacitor group are initialized according to an intermediate voltage generated by the resistance division, during a period from when the previous A/D conversion is ended to when the next A/D conversion is started. Therefore, it is not necessary to enhance the capability of the chopper comparator to maintain the A/D conversion accuracy as already described for the first embodiment, thereby achieving speedup and low power consumption while maintaining the A/D conversion accuracy.

Further, according to the sixth embodiment, since the originally provided reference resistor 15 is used as the fixed voltage supply circuit 24d, it is not necessary to add a new circuit other than a few analog switches for capacitor initialization, and control as to whether a fixed voltage should be supplied or not is carried out by only two signals, i.e., a reset signal and an inverted signal thereof. Therefore, the circuit area hardly increases even when the devices are integrated.

[Embodiment 7]

Figure 7A:
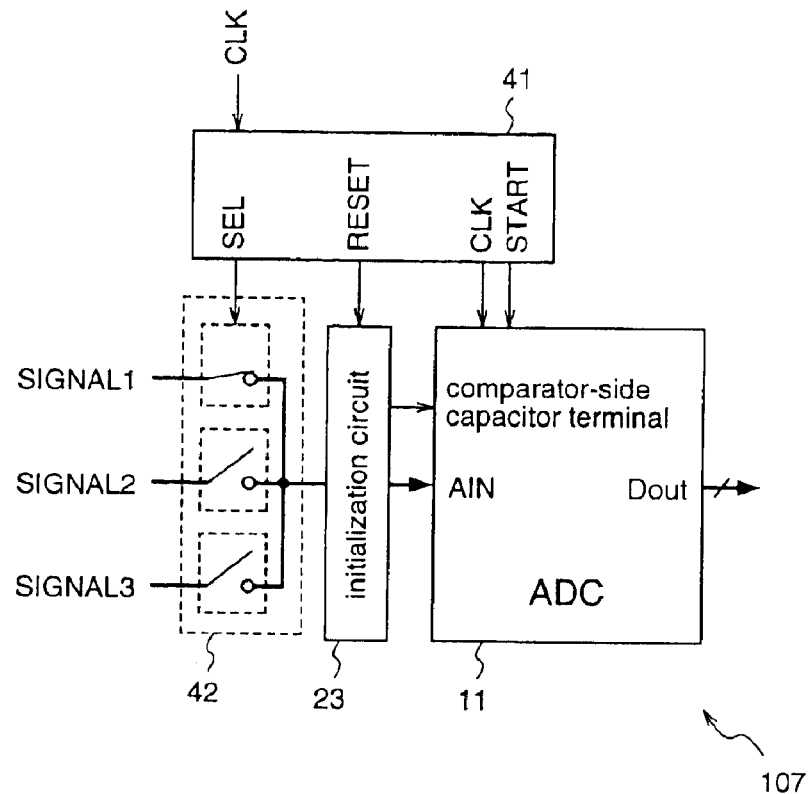
FIG. 7(a) is a circuit diagram illustrating the construction of a charge redistribution type A/D converter according to a seventh embodiment of the present invention.
Figure 7B:
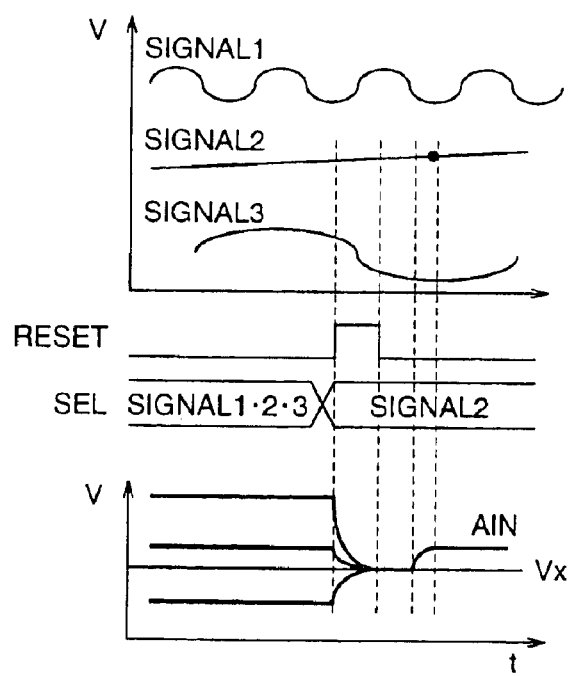
FIG. 7(b) is a diagram for explaining signals input to the A/D converter and capacitor initialization operation of the A/D converter.

FIG. 7 is a charge redistribution type A/D converter according to a seventh embodiment of the present invention.

The charge redistribution type A/D converter 107 according to the seventh embodiment is provided with an A/D converter core 11, a charge initialization circuit (initialization circuit) 23, a multiplexer 42 for selecting any of SIGNAL1~SIGNAL3 to be input to the charge initialization circuit 23, and a timing generation circuit 41 for generating timing signals to the A/D converter core 11, the charge initialization circuit 23, and the multiplexer 42. The A/D converter core 11 and the charge initialization circuit 23 are identical to those described for any of the first to sixth embodiments. Further, the timing generation circuit 41 corresponds to both of the SAR logic 16 and the external control circuit 30 shown in FIG. 1.

In the charge redistribution type A/D converter 107 constructed as described above, when the analog signal to be selected by the multiplexer changes from SIGNAL1 to SIGNAL2 or from SIGNAL3 to SIGNAL2, a RESET signal is generated from the timing generation circuit 41 immediately before sampling the analog signal SIGNAL2, and the charge stored in the capacitor in the A/D converter core 11 can be initialized to a predetermined value by the initialization circuit 23.

As a result, even when the analog input changes significantly, the conversion accuracy of the A/D conversion result can be maintained independently of the previous sampling value, whereby the sampling time can be shortened and the capability of the chopper comparator can be degraded, resulting in a high-speed and low-power-consumption A/D converter.

As described above, according to the seventh embodiment, when performing A/D conversion for an input signal that is selected by the multiplexer, by using the charge redistribution type A/D converter, the capacitance of the A/D converter is initialized by the initialization circuit. Therefore, it is not necessary to enhance the capability of the chopper comparator to maintain the A/D conversion accuracy as already described for the first embodiment, thereby achieving speedup and low power consumption while maintaining the A/D conversion accuracy.

[Embodiment 8]

Figure 8A:
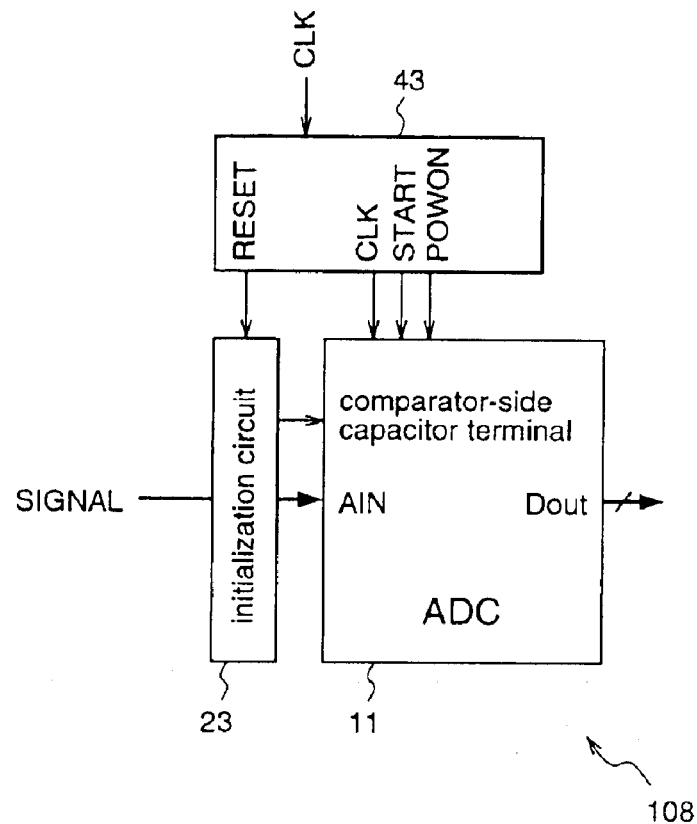
FIG. 8(a) is a circuit diagram illustrating the construction of a charge redistribution type A/D converter according to an eighth embodiment of the present invention.
Figure 8B:
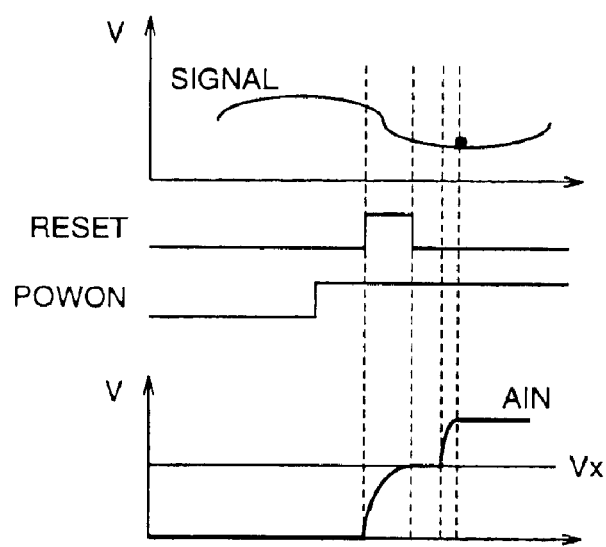
FIG. 8(b) is a diagram for explaining signals input to the A/D converter and capacitor initialization operation of the A/D converter.
Figure 9A:
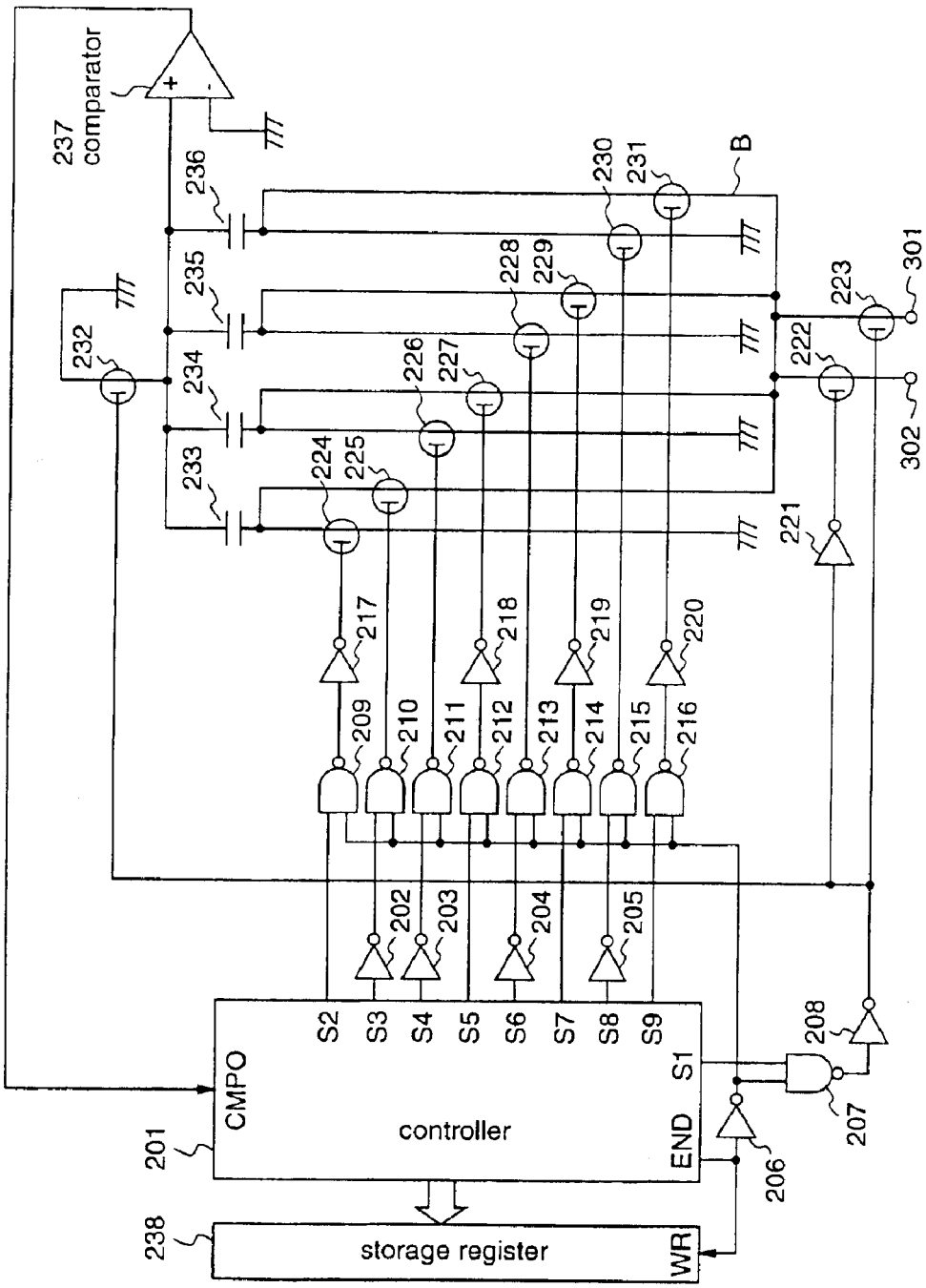
FIG. 9(a) is a circuit diagram illustrating the construction of a conventional charge redistribution type A/D converter.
Figure 9B:
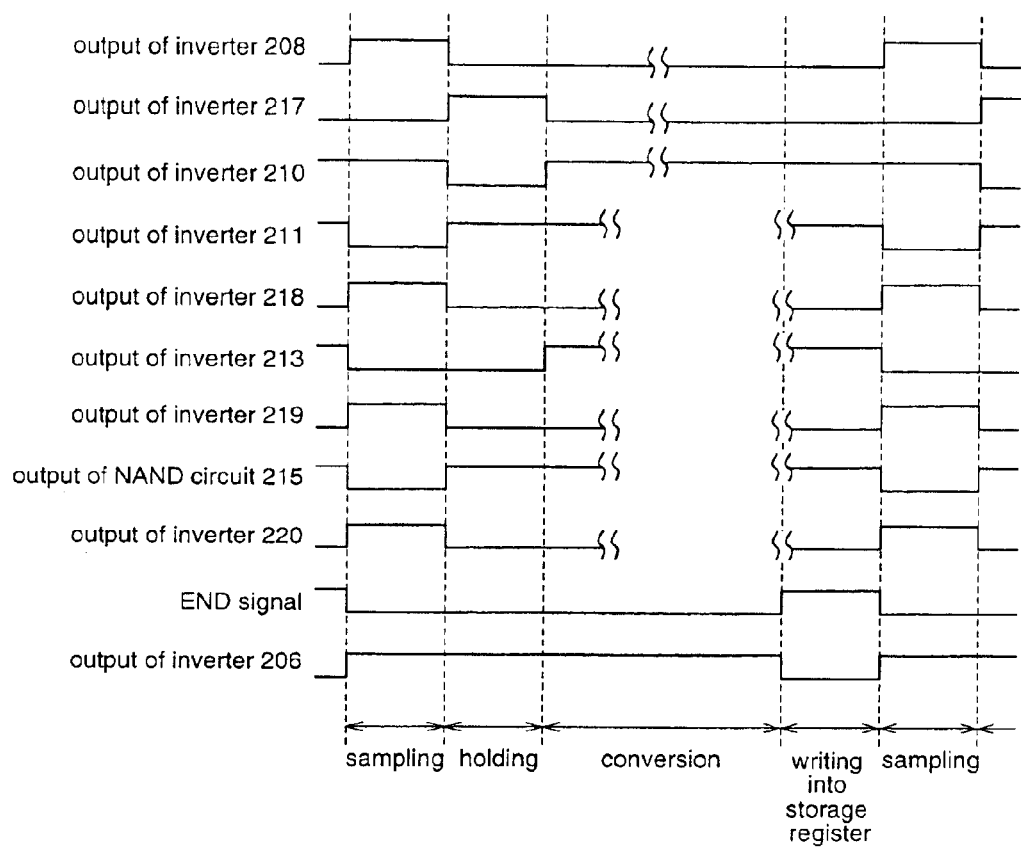
FIG. 9(b) is a diagram for explaining the operation of the A/D converter.
Figure 9C:
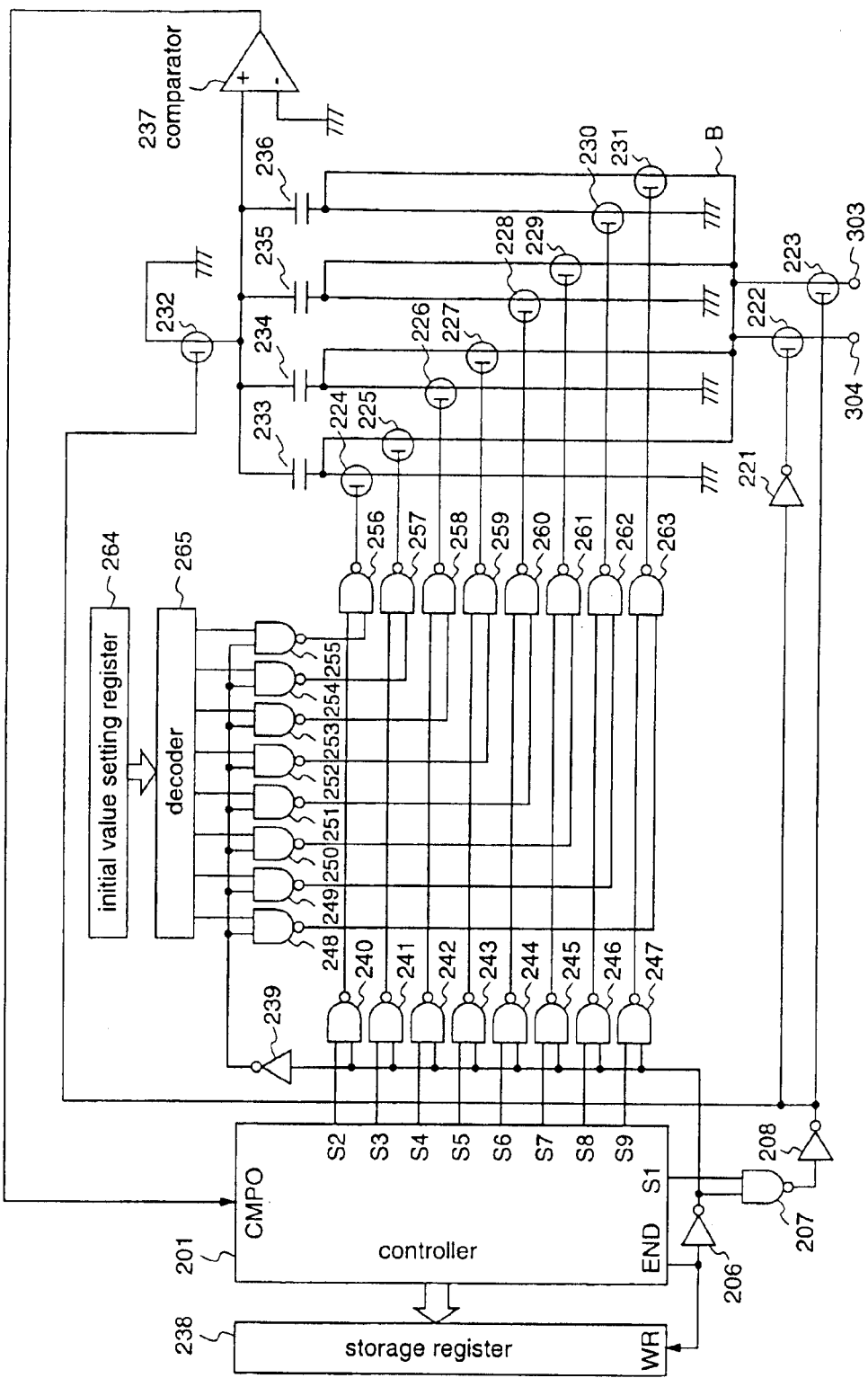
FIG. 9(c) is a circuit diagram illustrating the construction of another conventional charge redistribution type A/D converter.
Figure 9D:
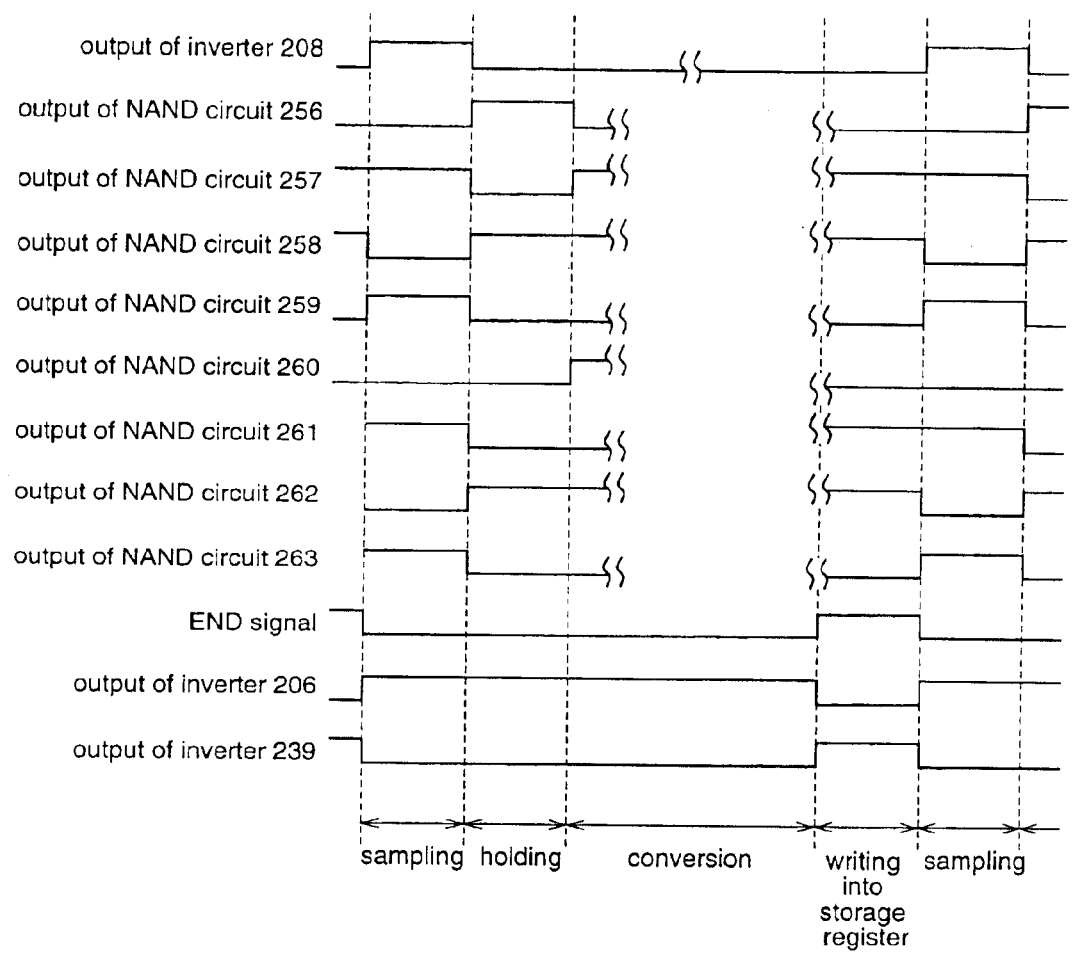
FIG. 9(d) is a diagram for explaining the operation of the A/D converter.

FIG. 8 is a block diagram illustrating a charge redistribution type A/D converter according to an eighth embodiment of the present invention.

The charge redistribution type A/D converter 108 according to the eighth embodiment is provided with an A/D converter core 11, a charge initialization circuit 23 receiving a SIGNAL, and a timing generation circuit 41 for generating timing signals to be supplied to the A/D converter core 11 and the charge initialization circuit 23. The A/D converter core 11 and the charge initialization circuit 23 may be those according to any of the first to sixth embodiments, or those included in a charge distribution type A/D converter that is similarly constituted.

In the charge redistribution type A/D converter 108 according to the eighth embodiment, when there is a large change in the amount of charge stored in the capacitor immediately after power on, the timing generation circuit 43 generates a RESET signal immediately before sampling an analog signal SIGNAL, whereby the charge stored in the capacitor inside the A/D converter core 11 can be initialized to a predetermined value.

As a result, even when the analog input changes significantly, the conversion accuracy of the result of A/D conversion can be maintained independently of the previous sampling value. Therefore, it is possible to shorten the sampling time to reduce the capability of the chopper comparator, resulting in a high-speed and low-power-consumption A/D converter.

As described above, according to the eighth embodiment, when A/D converting an input signal by the charge redistribution type A/D converter, the capacitance of the A/D converter is initialized by the initialization circuit. Therefore, it is not necessary to enhance the capability of the chopper comparator to maintain the A/D conversion accuracy as already described for the first embodiment, whereby speedup and low power consumption can be achieved while maintaining the A/D conversion accuracy.

The first to eighth embodiments of the present invention describe a charge redistribution type A/D converter using a chopper comparator and employing a four-bit construction in which the upper two bits correspond to a weighting capacitor and the lower two bits correspond to an R-2R resistor. However, the present invention is applicable to all kinds of charge redistribution type A/D converters regardless of the number of bits, the constructions of capacitors and resistors, and the construction of comparators.

Further, in the present invention, the charge stored in the capacitor immediately before sampling is initialized to a predetermined value. However, when a specific value frequently appears in the input analog signal, the value may be used as the predetermined value.

Furthermore, initialization of the charge stored in the capacitor immediately before sampling may be carried out only when the analog input signal changes significantly, thereby minimizing the effect of noise due to a RESET signal during capacitor initialization.

Furthermore, the present invention is applicable to sample hole circuits or various kinds of A/D converters having sample hold circuits as well as charge redistribution type A/D converters.

What is claimed is:

1. A charge redistribution type A/D converter for converting an input analog signal into an output digital signal, the charge redistribution type A/D converter comprising:

an initialization circuit operable to initialize electric charge stored in a capacitor, immediately before sampling the input analog signal;

wherein an input-side capacitor terminal and a comparator-side capacitor terminal of said capacitor are connected to a fixed voltage supply circuit through first and second analog switches, respectively, wherein said input-side capacitor terminal is connected to the outside through a third analog switch, and wherein said first and second analog switches are closed and said third analog switch is opened immediately before sampling the input analog signal, whereby fixed voltages are supplied to the input-side capacitor terminal and to the comparator-side capacitor terminal, respectively, to initialize the charge stored in the capacitor to a predetermined value.

2. An A/D converter as defined in claim 1, wherein said fixed voltage supply circuit is a circuit operable to supply fixed voltages obtained by predetermined voltage division using resistors.

3. An A/D converter as defined in claim 1, wherein said fixed voltage supply circuit comprises a sources follower using an operation amplifier.

4. An A/D converter as defined in claim 1, wherein said fixed-voltage supply circuit comprises and inverter circuit.

5. An A/D converter as defined in claim 1, wherein said fixed-voltage supply circuit comprises a chopper comparator in an auto-zero state.

6. An A/D converter as defined in claim 1, wherein said fixed voltage supply circuit comprises a reference resistor.

7. A charge redistribution type A/D converter for converting an input analog signal into an output digital signal, the charge redistribution type A/D converter comprising:

an initialization circuit operable to initialize electric charge stored in a capacitor, immediately before sampling the input analog signal;

a multiplexer operable to select one of a plurality of analog signals to be input to the initialization circuit; and a timing generation circuit operable to generate timing signals to be supplied to a core of the A/D converter, the initialization circuit, and the multiplexer, wherein, when the signal selected by the multiplexer is switched to another signal, said timing generation circuit generates a reset signal immediately before sampling the analog signal, and the charge stored in the capacitor is initialized to a predetermined value, thereby performing A/D conversion that is independent of a previous amount of charge.

8. A charge redistribution type A/D converter for converting an input analog signal into an output digital signal, the charge redistribution type A/D converter comprising:

an initialization circuit operable to initialize electric charge stored in a capacitor, immediately before sampling the input analog signal;

a timing generation circuit operable to generate timing signals to be supplied to a core of the A/D converter and the initialization circuit, wherein, when a change in an amount of charge stored in the capacitor is large immediately after power on, the timing generation circuit generates a reset signal immediately before sampling the input analog signal, and the charge stored in the capacitor is initialized to a predetermined value, thereby performing A/D conversion.

* * * * *